(12) United States Patent
Ota

(10) Patent No.: US 6,436,777 B1
(45) Date of Patent: Aug. 20, 2002

(54) SEMICONDUCTOR DEVICE AND MANUFACTURING METHOD THEREOF

(75) Inventor: Kazunobu Ota, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/836,371

(22) Filed: Apr. 18, 2001

(30) Foreign Application Priority Data

Oct. 19, 2000 (JP) ........................................ 2000-319318

(51) Int. Cl.[7] ..................... H01L 21/336; H01L 31/113; H01L 31/119
(52) U.S. Cl. .................... 438/305; 438/287; 257/410; 257/411
(58) Field of Search .................. 257/392, 410, 257/411; 438/287, 305

(56) References Cited

FOREIGN PATENT DOCUMENTS

| JP | 5-82740 | 4/1993 |
| JP | 11-135774 | * 5/1999 |

* cited by examiner

*Primary Examiner*—Alexander G. Guyka
(74) *Attorney, Agent, or Firm*—Oblon, Spivak, McClelland, Maier & Neustadt, P.C.

(57) ABSTRACT

An object is to provide a semiconductor device having an insulated-gate transistor which operates at high speed with low power consumption and a manufacturing method thereof. Two source/drain regions (9) are selectively formed in the surface of a transistor formation region in a Si substrate (1), a stacked gate insulating film (25) is formed on the channel region between the source/drain regions (9, 9) in the Si substrate (1), and a gate electrode (3) is formed on the stacked gate insulating film (25). The stacked gate insulating film (25) has a three-layer structure composed of a $HfSiO_2$ film (21), a $HfO_2$ film (22) and a $HfSiO_2$ film (23) each having a higher dielectric constant than $SiO_2$. The $HfSiO_2$ film (21) is less reactive than the $HfO_2$ film (22) at the interface with the Si substrate (1) and the $HfSiO_2$ film (23) is less reactive than the $HfO_2$ film (22) at the interface with the gate electrode (3) (polysilicon layer (4)).

18 Claims, 16 Drawing Sheets

F I G . 1 1
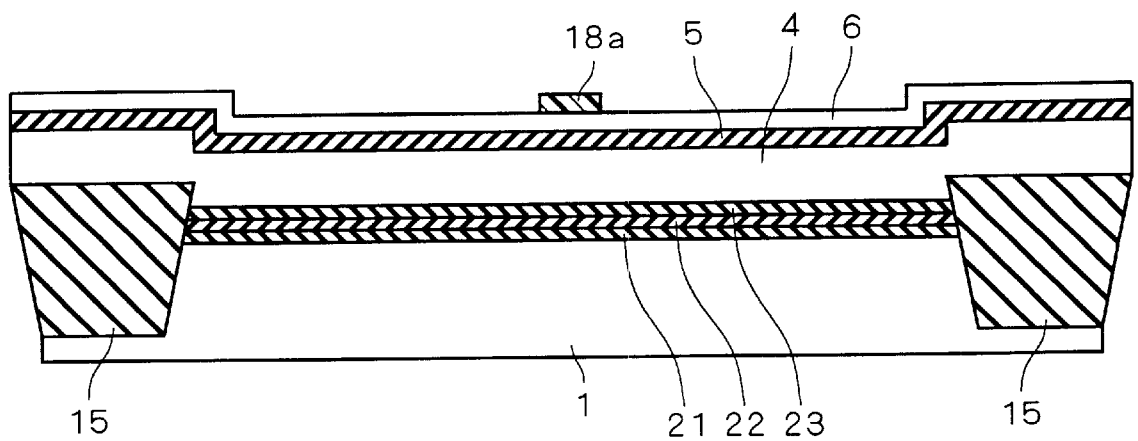
F I G . 1 2
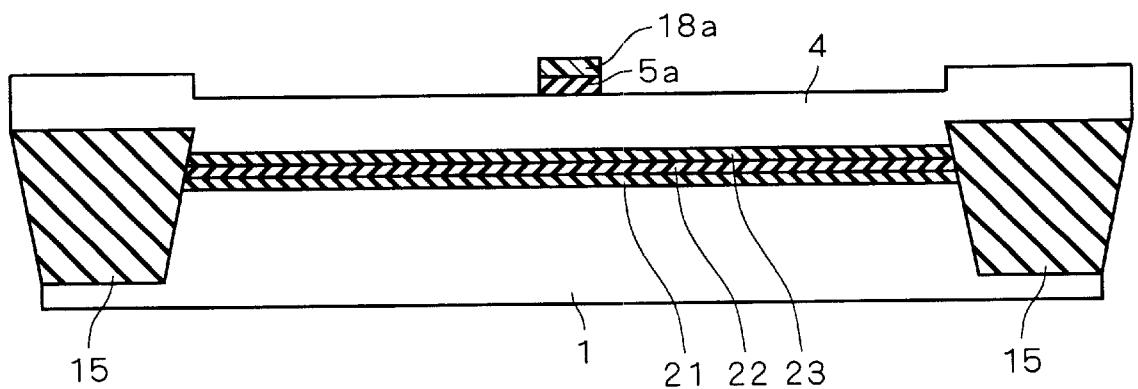

F I G . 2 7
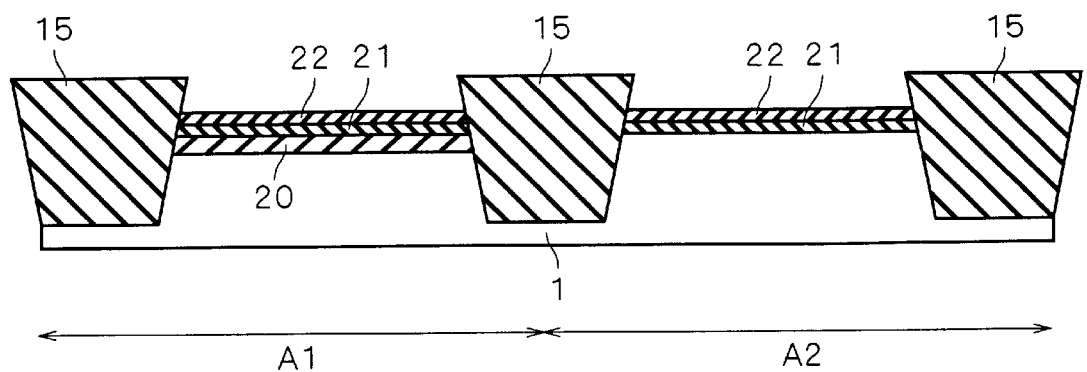
F I G . 2 8
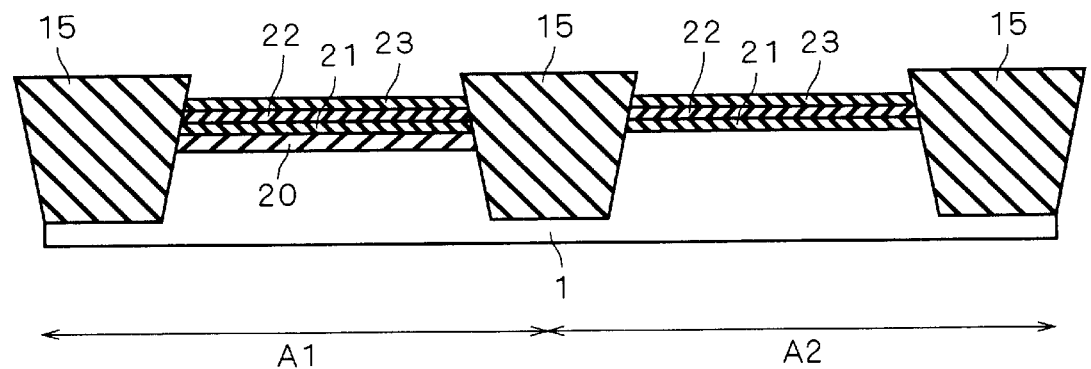

SEMICONDUCTOR DEVICE AND MANUFACTURING METHOD THEREOF

BACKGROUND OF THE INVENTION

1. Field of the Invention

The present invention relates to the structure of semiconductor devices and manufacturing methods thereof, and particularly to the structure of a gate insulating film of an insulated-gate transistor such as an MOS transistor.

2. Description of the Background Art

<MOS Transistor Structure>

FIG. 30 is a sectional view showing the structure of a conventional MOS transistor. As shown in this diagram, the MOS transistor is fabricated in the transistor formation region between element isolation oxide films 15, 15 formed in a Si substrate 1.

That is to say, two source/drain regions 9 are selectively formed in the surface of the transistor formation region of the Si substrate 1, a gate insulating film 2 is formed on the channel region between the source/drain regions 9, 9 in the Si substrate 1, a gate electrode 3 is formed on the gate insulating film 2, and side walls 16 are formed on the sides of the gate electrode 3.

The gate electrode 3 is composed of a polysilicon, layer 4 and a silicide layer 11 formed on top of it. Extension regions 8 extend under the side walls 16 from the source/drain regions 9 and silicide regions 10 are formed on the source/drain regions 9.

The gate insulating film 2 is formed of an oxide film or an oxynitride film or a stacked layer thereof. While the gate electrode 3 is mainly formed of the polysilicon layer 4 in the example of FIG. 30, it may be formed by using amorphous silicon as a constituent material.

<Manufacturing Method>

A method for manufacturing the MOS transistor structured as shown in FIG. 30 is now described.

First, the Si substrate 1 is sectioned with an element isolation structure, such as trench isolation using the element isolation oxide films 15. Subsequently the entire surface of the Si substrate 1 is thermally oxidized to form the gate insulating film 2. The polysilicon layer 4 is then laid on the gate insulating film 2.

Next, an oxide film of TEOS etc. is formed as a hard mask on the polysilicon layer 4 and is patterned by photolithography. Next, the polysilicon layer 4 is anisotropically etched by using the patterned oxide film as a mask (hard mask) to form the gate.

Then an impurity ion implantation is applied by using the gate-shaped polysilicon layer 4 as a mask to form impurity diffusion regions (the extension regions 8 and source/drain regions 9) and the side walls 16 are formed on the sides of the gate-shaped polysilicon layer 4. In this process, the impurity diffusion regions under the side walls 16 form the extension regions 8.

Next, an impurity ion implantation is applied by using the gate-shaped polysilicon layer 4 and the side walls 16 as masks to form the source/drain regions 9 adjoining the extension regions 8.

Subsequently the oxide film as a hard mask is etched to expose the top surface of the gate-shaped polysilicon layer 4 and then a metal such as cobalt is applied to the entire wafer surface, which is followed by annealing.

Then silicidation occurs in the upper part of the gate-shaped polysilicon layer 4 and in the upper part of the source/drain regions 9 to form the silicide layer 11 and silicide regions 10. Unreacted metal is removed by wet etching.

The MOS transistor structure shown in FIG. 30 is thus completed through the above-described processes. Then a semiconductor device containing the MOS transistor is completed through formation of interlayer insulating films not shown in FIG. 30, interconnecting process, etc.

For newer generations of semiconductor devices containing MOS transistors as shown in FIG. 30, there is an increasing necessity to reduce the power consumption by lowering the power-supply voltage and to enhance the driving current.

That is to say, lowering the power consumption and increasing the speed of semiconductor devices with MOS transistors require lowering the power-supply voltage and increasing the driving current, which have conventionally been realized mainly by reducing the thickness of the $SiO_2$ gate insulating films (i.e. gate insulating films made of $SiO_2$) in the MOS transistors.

FIG. 31 is an explanation diagram showing the off-operation state of the MOS transistor shown in FIG. 30, where the MOS transistor is constructed as an NMOS structure. As shown in this diagram, a source terminal 12 is provided on one of the two source/drain regions 9 (silicide regions 10) and a drain terminal 13 is provided on the other. A gate terminal 14 is provided on the gate electrode 3 and a substrate potential terminal 17 is provided on the Si substrate 1. The source terminal 12, gate terminal 14 and substrate potential terminal 17 are set at a potential of 0 V and the drain terminal 13 is set at a potential of 1.5 V.

When the $SiO_2$ gate insulating film is thinned to a film thickness of 3 nm or smaller, then direct tunneling through the gate insulating film 2 will cause serious gate leakage current I1 as shown in FIG. 31. The gate leakage current I1 may become almost equal to or higher than the leakage current I2 through the normal channel and then it cannot be neglected. That is to say, the standby power (the power in standby state) of the LSI becomes high over the negligible level; the performance of the transistors cannot be further enhanced by thinning the gate insulating films.

As described above, in achieving lower power consumption and higher operation speed of the MOS transistors, the use of $SiO_2$ as a material of the gate insulating films is reaching a limit and attempts are being made to obtain materials and structures of the gate insulating films which can overcome this problem. In such attempts, high dielectric constant materials having higher dielectric constants than $SiO_2$, such as $HfO_2$, $ZrO_2$, etc., are regarded as likely candidates since these materials are less reactive to the Si substrate in which the MOS transistors are fabricated.

However, it is known that, even when a high dielectric constant material as shown above is used to form the gate insulating film, it reacts with the Si substrate in high temperature processing performed after formation of the gate insulating film and thus forms an oxide film between the Si substrate and itself. The oxide film formed between the Si substrate and the high dielectric constant material reduces the dielectric constant of the gate capacitor structure which has attained large capacitance through the use of the high dielectric constant material. Furthermore, the oxide film obtained by the interface reaction with the Si substrate is uneven rather than flat, which reduces the mobility of carries in the channel formed in the Si substrate under the gate insulating film, thus reducing the driving current.

SUMMARY OF THE INVENTION

A first aspect of the present invention is directed to a semiconductor device which includes an insulated-gate transistor fabricated in a silicon substrate, the transistor comprising a gate insulating film selectively formed on the silicon substrate, the surface of the silicon substrate under the gate insulating film being defined as a channel region, a gate electrode formed of polysilicon on the gate insulating film, and first and second source/drain regions formed in the surface of the silicon substrate with the channel region interposed therebetween, wherein the gate insulating film contains a material having a higher dielectric constant than silicon oxide film and the gate insulating film comprises an upper part, a center part and a lower part, and wherein the lower part is less reactive with the silicon substrate than the center part is and the upper part is less reactive with the gate electrode than the center part is.

Preferably, according to a second aspect, in the semiconductor device, the gate insulating film has first to third high dielectric constant insulating films each having a dielectric constant higher than that of silicon oxide film and the first to third high dielectric constant insulating films are stacked in the first to third order, the lower part includes the first high dielectric constant insulating film, the center part includes the second high dielectric constant insulating film, and the upper part includes the third high dielectric constant insulating film.

Preferably, according to a third aspect, in the semiconductor device, the transistor includes first and second transistors, the first and second transistors each having the gate insulating film, the gate electrode and the first and second source/drain regions, and the gate insulating film of the first transistor is thicker than the gate insulating film of the second transistor.

Preferably, according to a fourth aspect, in the semiconductor device, a first gate insulating film being the gate insulating film of the first transistor has an insulating film and first to third high dielectric constant insulating films each having a higher dielectric constant than silicon oxide film, and the insulating film and the first to third high dielectric constant insulating films are stacked in this order, wherein the lower part of the first gate insulating film includes the insulating film and the first high dielectric constant insulating film, the center part of the first gate insulating film includes the second high dielectric constant insulating film, and the upper part of the first gate insulating film includes the third high dielectric constant insulating film, a second gate insulating film being the gate insulating film of the second transistor has fourth to sixth high dielectric constant insulating films each having a higher dielectric constant than silicon oxide film, and the fourth to sixth high dielectric constant insulating films are stacked in the fourth to sixth order, wherein the lower part of the second gate insulating film includes the fourth high dielectric constant insulating film, the center part of the second gate insulating film includes the fifth high dielectric constant insulating film, and the upper part of the second gate insulating film includes the sixth high dielectric constant insulating film.

Preferably, according to a fifth aspect, in the semiconductor device, the first and fourth high dielectric constant insulating films are composed of the same material, the second and fifth high dielectric constant insulating films are composed of the same material, and the third and sixth high dielectric constant insulating films are composed of the same material.

A sixth aspect is directed to a method for manufacturing a semiconductor device which includes an insulated-gate transistor fabricated in a silicon substrate. According to the sixth aspect, the semiconductor device manufacturing method comprises the steps of: (a) selectively forming a gate insulating film on the silicon substrate, the surface of the silicon substrate under the gate insulating film being defined as a channel region; (b) forming a gate electrode made of polysilicon on the gate insulating film; (c) forming first and second source/drain regions in the surface of the silicon substrate with the channel region interposed therebetween, wherein the first and second source/drain regions, the gate insulating film and the gate electrode define the transistor, wherein the gate insulating film is formed by using a material having a higher dielectric constant than silicon oxide film, the gate insulating film comprising an upper part, a center part and a lower part, the lower part is less reactive with the silicon substrate than the center part is, and the upper part is less reactive with the gate electrode than the center part is.

Preferably, according to a seventh aspect, in the semiconductor device manufacturing method, the gate insulating film includes first to third high dielectric constant insulating films having a higher dielectric constant than silicon oxide film, the lower part includes the first high dielectric constant insulating film, the center part includes the second high dielectric constant insulating film, and the upper part includes the third high dielectric constant insulating film, the step (a) comprising the steps of (a-1) forming the first high dielectric constant insulating film on the silicon substrate, (a-2) forming the second high dielectric constant insulating film on the first high dielectric constant insulating film, and (a-3) forming the third high dielectric constant insulating film on the second high dielectric constant insulating film.

Preferably, according to an eighth aspect, in the semiconductor device manufacturing method, the transistor includes first and second transistors formed in first and second formation regions in the silicon substrate, the first and second transistors each having the gate insulating film, the gate electrode and the first and second source/drain regions, wherein the step (a) includes a step of forming the gate insulating film of the first transistor thicker than the gate insulating film of the second transistor.

Preferably, according to a ninth aspect, in the semiconductor device manufacturing method, a first gate insulating film being the gate insulating film of the first transistor has an insulating film and first to third high dielectric constant insulating films having a higher dielectric constant than silicon oxide film, wherein the lower part of the first gate insulating film includes the insulating film and the first high dielectric constant insulating film, the center part of the first gate insulating film includes the second high dielectric constant insulating film, and the upper part of the first gate insulating film includes the third high dielectric constant insulating film, and a second gate insulating film being the gate insulating film of the second transistor has fourth to sixth high dielectric constant insulating films having a higher dielectric constant than silicon oxide film, wherein the lower part of the second gate insulating film includes the fourth high dielectric constant insulating film, the center part of the second gate insulating film includes the fifth high dielectric constant insulating film, and the upper part of the second gate insulating film includes the sixth high dielectric constant insulating film, the step (a) comprising the steps of (a-1) forming the insulating film on the first formation region, (a-2) forming the first high dielectric constant insulating film on the insulating film, (a-3) forming the second high dielectric constant insulating film on the first high dielectric constant insulating film, (a-4) forming the third high dielectric constant insulating film on the second high dielectric constant insulating film, (a-5) forming the fourth high dielectric constant insulating film on the second formation region, (a-6) forming the fifth high dielectric constant insulating film on the fourth high dielectric constant insulating film, and (a-7) forming the sixth high dielectric constant insulating film on the fifth high dielectric constant insulating film.

Preferably, according to a tenth aspect, in the semiconductor device manufacturing method, the first and fourth high dielectric constant insulating films are formed of the same material, the second and fifth high dielectric constant insulating films are formed of the same material, the third and sixth high dielectric constant insulating films are formed of the same material, the steps (a-2) and (a-5) are simultaneously performed, the steps (a-3) and (a-6) are simultaneously performed, and the steps (a-4) and (a-7) are simultaneously performed.

As described above, in the transistor of the semiconductor device according to the first aspect of the invention, the gate insulating film contains a material having a higher dielectric constant than a silicon oxide film. Therefore the dielectric constant of the gate capacitor structure composed of the gate electrode, gate insulating film and channel region can be set higher than when the gate insulating film is composed of a silicon oxide film.

In addition, the upper part of the gate insulating film has lower reactivity to the gate electrode than the center part does and the lower part has lower reactivity to the silicon substrate than the center part does. This prevents interface reaction between the upper part and the gate electrode and between the lower part and the silicon substrate, thereby preventing reduction in the dielectric constant of the gate capacitor structure and reduction in the mobility of carriers in the channel.

As a result, the semiconductor device of the first aspect offers a transistor whose gate electrode is composed of polysilicon and which can operate at high speed even at lower power-supply voltages, thus achieving lower power consumption and higher speed operation.

According to the transistor of the semiconductor device of the second aspect, a stacked structure is formed of the first to third high dielectric constant insulating films each having a higher dielectric constant than a silicon oxide film. It is thus possible to relatively easily obtain a gate insulating film whose dielectric constant is higher than that of silicon oxide film and in which the reactivity to the silicon substrate and the gate electrode is lower in the lower and upper parts than in the center part.

According to the semiconductor device of the third aspect, the gate insulating film of the first transistor has a larger film thickness than the gate insulating film of the second transistor. Therefore the structure of the first transistor is more suitable for high voltage operation than the second transistor, so that the transistors can be properly used in suitable voltage ranges; e.g. the first transistor can be used for operation at higher voltage and the second transistor can be used for operation at lower voltage.

According to the first transistor of the semiconductor device of the fourth aspect, a stacked structure is formed of an insulating film and the first to third high dielectric constant insulating films each having a higher dielectric constant than a silicon oxide film. It is thus possible to relatively easily obtain a gate insulating film whose dielectric constant is higher than that of silicon oxide film and in which the lower and upper parts are less reactive than the center part with the silicon substrate and the gate electrode.

Similarly, the second transistor has a stacked structure of the fourth to sixth high dielectric constant insulating films each having a higher dielectric constant than a silicon oxide film. It is thus possible to relatively easily obtain a gate insulating film whose dielectric constant is higher than that of silicon oxide film and which is less reactive with the silicon substrate and the gate electrode in the lower and upper parts than in the center part.

According to the semiconductor device of the fifth aspect, it is possible to simultaneously form the first and fourth high dielectric constant insulating films, the second and fifth high dielectric constant insulating films, and the third and sixth high dielectric constant insulating films. This offers a simple manufacturing process.

In a transistor manufactured by the semiconductor device manufacturing method of the sixth aspect of the invention, the gate insulating film contains a material having a higher dielectric constant than silicon oxide film, so that the dielectric constant of the gate capacitor structure of the gate electrode, gate insulating film and channel region can be set higher than when the gate insulating film is made of a silicon oxide film.

In addition, the upper part of the gate insulating film is less reactive with the gate electrode than the center part and the lower part is less reactive with the silicon substrate than the center part. This prevents the problem that interface reaction between the upper part and the gate electrode or between the lower part and the silicon substrate reduces the dielectric constant of the gate capacitor structure and the mobility of carriers in the channel.

As a result, the semiconductor device manufacturing method of the sixth aspect can manufacture a semiconductor device comprising a transistor whose gate electrode is composed of polysilicon and which can operate at high speed even at lower power-supply voltage, thus achieving lower power consumption and higher speed operation.

According to the semiconductor device manufacturing method of the seventh aspect, it is possible to relatively easily obtain, through the relatively easy process of the steps (a-1) to (a-3), a gate insulating film which has a higher dielectric constant than silicon oxide film and in which the reactivity to the silicon substrate and the gate electrode is lower in the lower and upper parts than in the center part.

According to the semiconductor device manufacturing method of the eighth aspect, the step (a) forms the gate insulating film of the first transistor thicker than the gate insulating film of the second transistor, so that the structure of the first transistor is more suitable for high voltage operation than the second transistor. The method thus provides a semiconductor device in which the transistors can be properly used in suitable voltage ranges; e.g. the first transistor can be used for higher voltage operation and the second transistor can be used for lower voltage operation.

According to the semiconductor device manufacturing method of the ninth aspect, it is possible to relatively easily obtain, through the relatively easy process of the steps (a-1) to (a-4), the gate insulating film of the first transistor which has a higher dielectric constant than silicon oxide film and which has the lower and upper parts less reactive with the silicon substrate and the gate electrode than the center part.

Similarly, it is possible to relatively easily obtain, through the relatively easy process of the steps (a-5) to (a-7), the gate insulating film of the second transistor which has a higher dielectric constant than silicon oxide film and Which has the lower and upper parts less reactive than the center part with the silicon substrate and the gate electrode.

In addition, the first gate insulating film of the first transistor can be formed thicker by the thickness of the insulating film than the second gate insulating film of the second transistor through the easy process of forming the first to third high dielectric constant insulating films and the fourth to sixth high dielectric constant insulating films to approximately equal total film thickness.

According to the semiconductor device manufacturing method of the tenth aspect, the steps (a-2) and (a-5), the steps (a-3) and (a-6) and the steps (a-4) and (a-7) can be simultaneously carried out to simplify the manufacturing process.

The present invention has been made to solve the aforementioned problem and an object of the present invention is to obtain a semiconductor device which contains an insulated-gate transistor which operates at high speed with low power consumption and a manufacturing method thereof.

These and other objects, features, aspects and advantages of the present invention will become more apparent from the following: detailed description of the present invention when taken in conjunction with the accompanying drawings.

BRIEF DESCRIPTION OF THE DRAWINGS

FIGS. 2 to 18 are sectional views showing a manufacturing method according to the first preferred embodiment.

FIGS. 20 to 29 are sectional views showing a manufacturing method according to the second preferred embodiment.

DESCRIPTION OF THE PREFERRED EMBODIMENTS

<<First Preferred Embodiment>>
<Principle>

A two-layer gate insulating film structure is being proposed in order to reduce the interface reaction between a gate insulating film made of a high dielectric constant material and a Si substrate. In the two-layer gate insulating film structure, a silicate layer made of $HfSiO_2$ layer etc. is interposed between a high dielectric constant material, such as $HfO_2$, and the Si substrate; while a silicate layer of $HfSiO_2$ etc. has a lower dielectric constant than $HfO_2$, it is less reactive with Si and has a higher dielectric constant than $SiO_2$.

This structure works well when the gate electrode is made of metal. However, when the gate electrode is made of polysilicon as in conventional ones, an oxide film is formed between the polysilicon and the high dielectric constant gate insulating film, which reduces the effective dielectric constant and the mobility in the channel.

Even when the gate electrode is made of metal, the structure encounters other performance problems; for example, metal is readily soluble in cleaning chemicals generally used in process and its work function is so difficult to control that the threshold voltage cannot be freely controlled.

Giving priority to performance such as the threshold voltage controllability and thus assuming that polysilicon is used as the gate electrode, the present invention proposes a stacked gate insulating film having a three-layer gate insulating film structure to offer a structure free from interface reaction with polysilicon, where a silicate layer of $HfSiO_2$ etc. is interposed between the high dielectric constant material of $HfO_2$ etc. and the polysilicon in the aforementioned two-layer gate insulating film structure; a silicate layer of $HfSiO_2$ etc. is less reactive with Si than $HfO_2$ is and has a higher dielectric constant than $SiO_2$.

<Structure>

Figure 1:
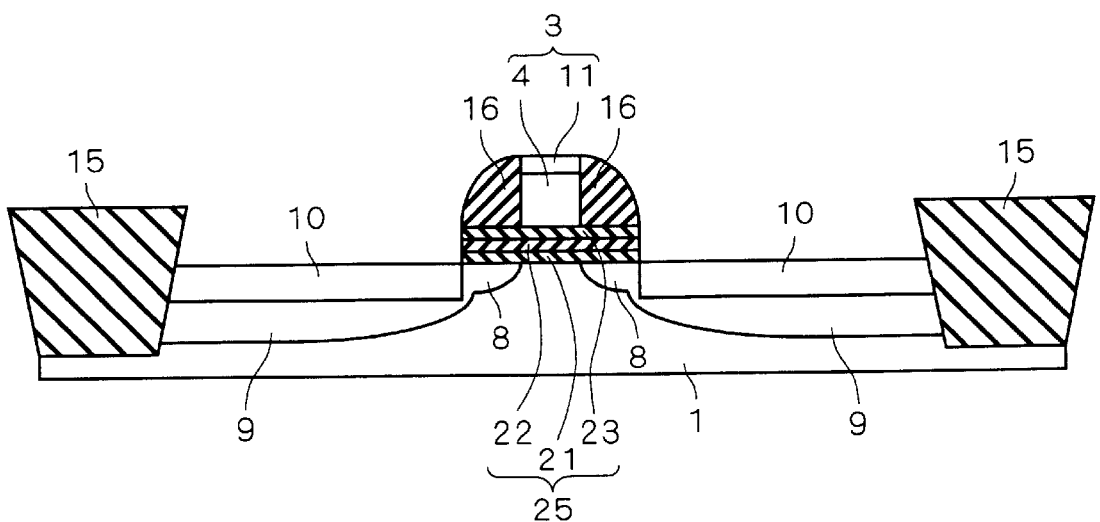
FIG. 1 is a sectional view showing the structure of an MOS transistor used in a semiconductor device according to a first preferred embodiment of the present invention.

FIG. 1 is a sectional view showing the structure of an MOS transistor used in a semiconductor device according to a first preferred embodiment of the invention. As shown in this diagram, the MOS transistor is fabricated in the transistor formation region enclosed by element isolation oxide films 15, 15 in the Si substrate 1.

That is to say, two source/drain regions 9 are selectively formed in the surface of the transistor formation region in the Si substrate 1 and a stacked gate insulating film 25 is formed on the channel region between the source/drain regions 9, 9 in the Si substrate 1. The stacked gate insulating film 25 is composed to a three-layer structure including a $HfSiO_2$ film 21, a $HfO_2$ film 22 and a $HfSiO_2$ film 23 each having a higher dielectric constant than $SiO_2$.

The $HfSiO_2$ film 21 is less reactive than the $HfO_2$ film 22 at the interface with the Si substrate 1, and the $HfSiO_2$ film 23 is less reactive than the $HfO_2$ film 22 at the interface with the gate electrode 3 (polysilicon layer 4).

The gate electrode 3 is formed on the stacked gate insulating film 25 and side walls 16 are formed on the sides of the gate electrode 3. The gate electrode 3 is composed of the polysilicon layer 4 and a silicide layer 11 formed thereon. Extension regions 8 extend from the source/drain regions 9 under the side walls 16 and silicide regions 10 are formed in the upper part of the source/drain regions 9.

<Manufacturing Method>

FIGS. 2 to 18 are sectional views showing a method of manufacturing the MOS transistor of the first preferred embodiment shown in FIG. 1. The method for manufacturing the MOS transistor in the semiconductor device of the first preferred embodiment is now described referring to these diagrams.

(Element Isolation)

Figure 2:
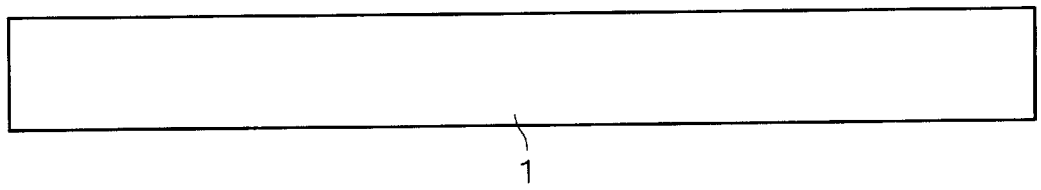
Figure 3:
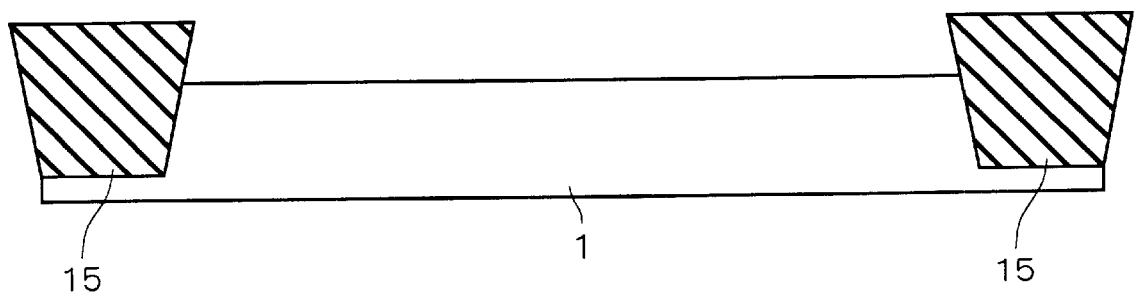

First, the Si substrate is prepared as shown in FIG. 2. Then the Si substrate 1 is sectioned by element isolation of the trench isolation using the element isolation oxide films 15 as shown in FIG. 3 and the element formation region is thus formed between the element isolation oxide films 15, 15. The element isolation oxide films 15 do not reach the back of the Si substrate 1, so that part of the Si substrate 1 remains under the element isolation oxide films 15.

(Formation of Stacked High Dielectric Constant Insulating Films)

Figure 4:
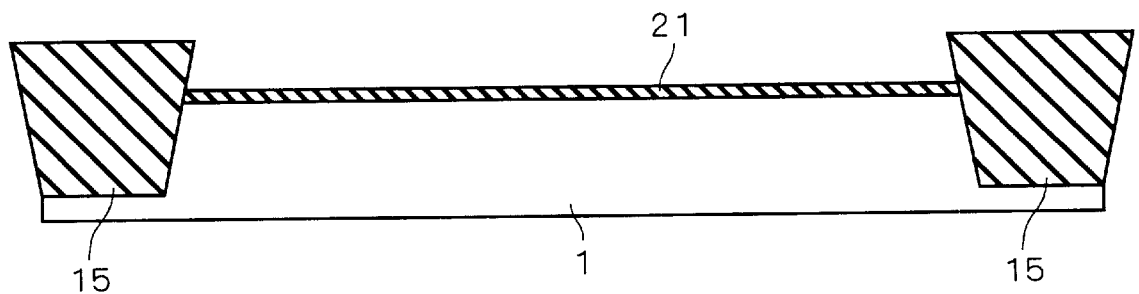
Figure 5:
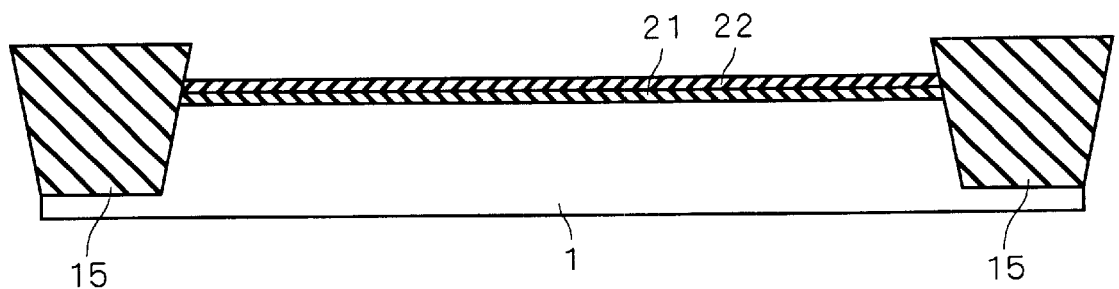
Figure 6:
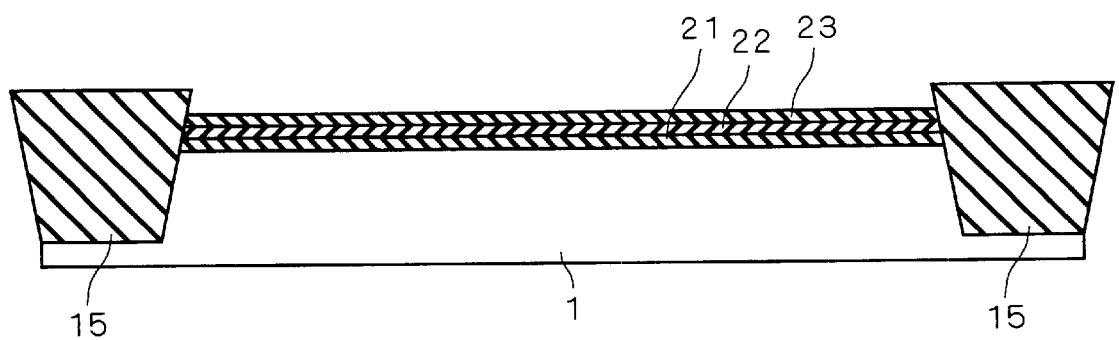

Next, as shown in FIGS. 4 to 6, a series of CVD processes are performed to sequentially deposit the $HfSiO_2$ film 21, $HfO_2$ film 22 and $HfSiO_2$ film 23, so as to form the three-layered insulating film. For their film thickness, the $HfSiO_2$ film 21 is 0.3 to 2 nm thick (3 to 20 angstroms), the $HfO_2$ film 22 is 0.5 to 3 nm thick (5 to 30 angstroms), and the $HfSiO_2$ film 23 is 0.3 to 2 nm thick (3 to 20 angstroms).

The $HfO_2$ film 22 may be formed by evaporating Hf (hafnium) in a vacuum and oxidizing it by using $O_2$ etc. to form $HfO_2$. Similarly, the $HfSiO_2$ 21 and 23 may be formed by evaporating HfSi in a vacuum and oxidizing it with $O_2$ etc.

The material is not limited to Hf. It can be Zr (zirconium) or La (lanthanum) or a combination of these materials, as long as a three-layer structure of silicate/oxide/silicate can be formed by using materials whose dielectric constants are higher than that of silicon.

(Deposition of Gate Electrode Material)

Figure 7:
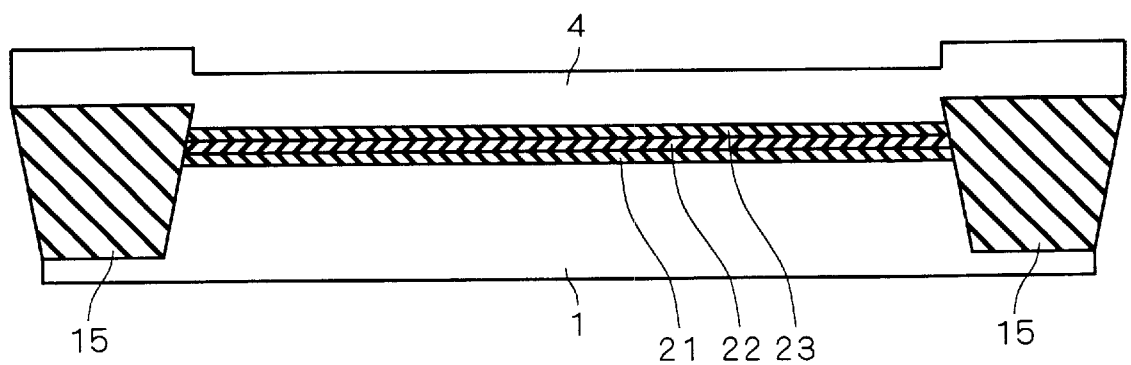

Subsequently, the polysilicon layer 4 is formed all over the surface as shown in FIG. 7. The film thickness of the polysilicon layer 4 is 50 to 300 nm, for example.

Polysilicon germanium or a stacked structure of polysilicon germanium and polysilicon may be used in place of the polysilicon layer 4. The polysilicon may be doped-polysilicon which has been previously doped with phosphorus. Alternatively, non-doped polysilicon may be laid and then undergo ion implantation of phosphorus in the NMOS (transistor formation) region and of boron in the PMOS region. During the ion implantation, it is necessary to mask areas where the implantation is unwanted with photoresist (not shown) and to remove the photoresist after the implantation. The impurity concentration in the ion implantation can be $1\times10^{19}$ to $1\times10^{21}$ cm$^{-3}$, for example.

Figure 8:
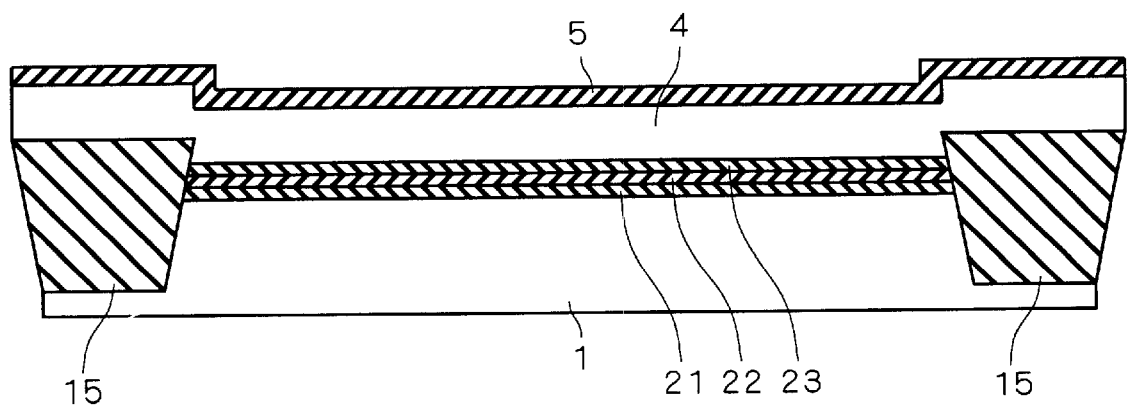
Figure 9:
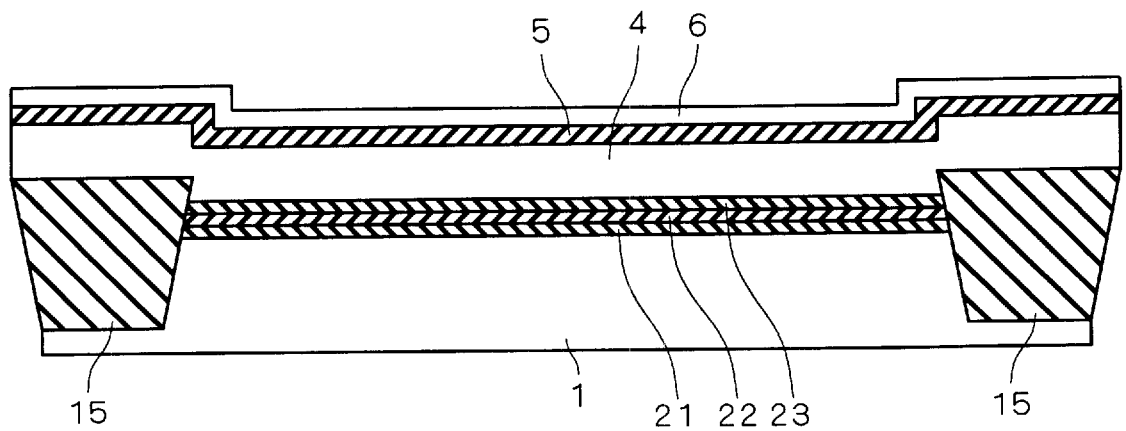

Subsequently an oxide film 5 used as a hard mask is formed on the polysilicon layer 4 as shown in FIG. 8 and an anti-reflection coating film 6 is formed on the oxide film 5 as shown in FIG. 9. The oxide film 5 is formed to a thickness of 20 to 200 nm.

(Gate Electrode)

Figure 10:
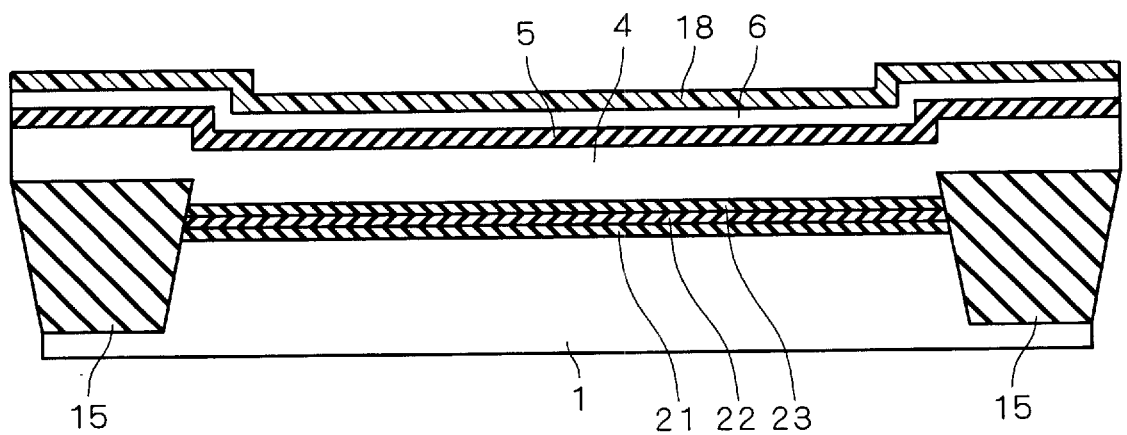

Next, resist 18 is applied on the entire surface as shown in FIG. 10, and a mask pattern for the gate electrode is then transferred onto the resist 18 as shown in FIG. 11, which is developed to form a resist pattern 18a. The gate width is 0.05 to 0.3 μm, for example.

Figure 13:
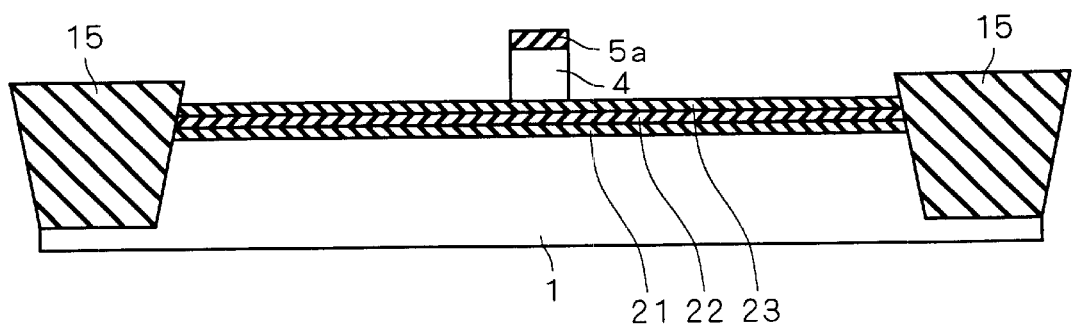

Next, as shown in FIG. 12, the oxide film 5 as a hard mask is etched by using the resist pattern 18a as a mask to obtain a hard mask pattern 5a. Subsequently, as shown in FIG. 13, the polysilicon layer 4 is etched by using the hard mask pattern 5a.

(Source/drain Regions and Extension Regions)

Figure 14:
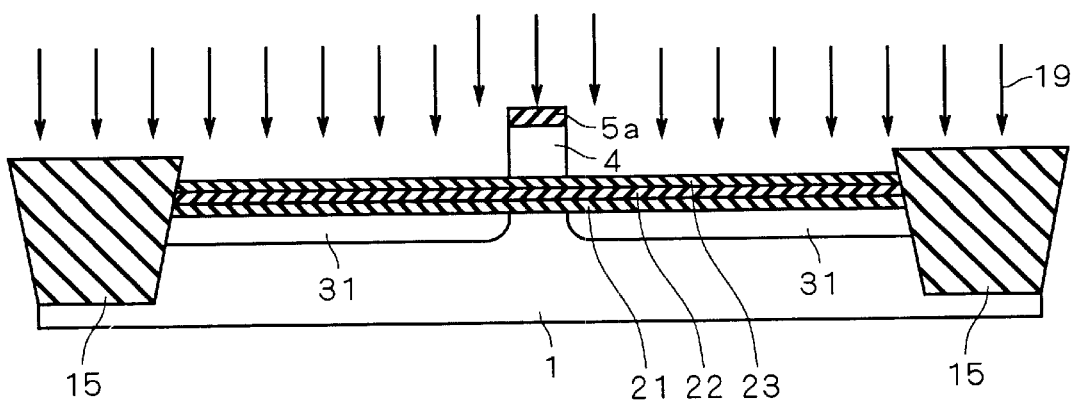

Next, as shown in FIG. 14, impurity ions 19 are implanted to form impurity diffusion regions 31 in the upper part of the NMOS and PMOS formation regions, which will form the source/drain regions 9 and the extension regions 8 later. During this process, in the NMOS and PMOS formation regions, areas not to be subjected to the ion implantation are masked with photoresist (not shown). For the ion implantation to NMOS, arsenic is implanted at an implant energy of 0.1 to 10 keV with a dose of $2\times10^{14}$cm$^{-2}$ to $5\times10^{15}$cm$^{-2}$, for example. For PMOS, BF$_2$ is implanted at an implant energy of 0.1 to 10 keV with a dose of $1\times10^{14}$cm$^{-2}$ to $5\times10^{15}$cm$^{-2}$, for example.

Further, though not shown in FIG. 14, pocket ion implantation is applied (to form pocket regions). For example, for the pocket ion implantation to NMOS, boron is implanted at an implant energy of 10 to 30 keV with a dose of $1\times10^{13}$cm$^{-2}$ to $5\times10^{13}$cm$^{-2}$, for example. For PMOS, arsenic is implanted at an implant energy of 50 to 200 keV with a dose of $1\times10^{13}$cm$^{-2}$ to $5\times10^{13}$cm$^{-2}$, for example. The pocket ion implantation is applied with the axis of implantation rotated with a tilt angle of 10 to 50° so that the impurities will be implanted under the gate.

Subsequently a thermal process is performed to activate the impurities in the impurity diffusion regions 31. The thermal process is performed at 800 to 1100° C. for 5 to 60 sec.

(Side Walls)

Figure 15:
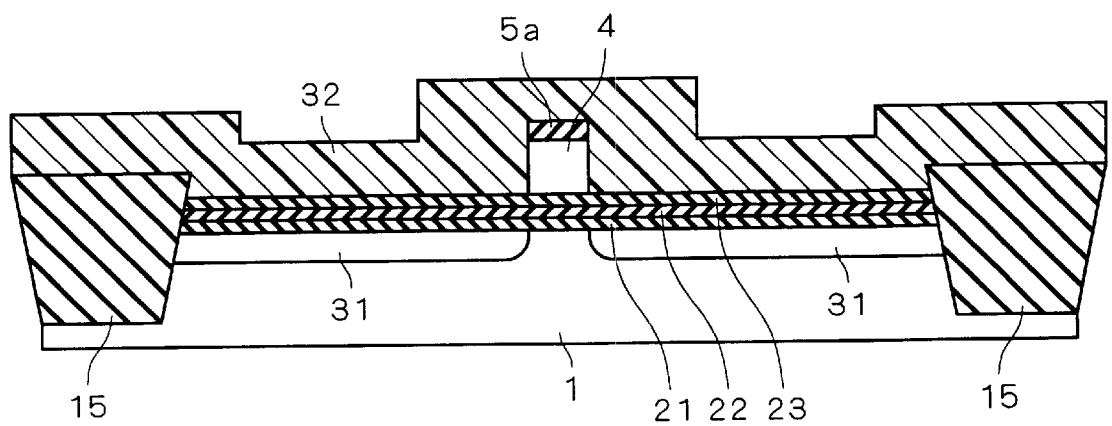
Figure 16:
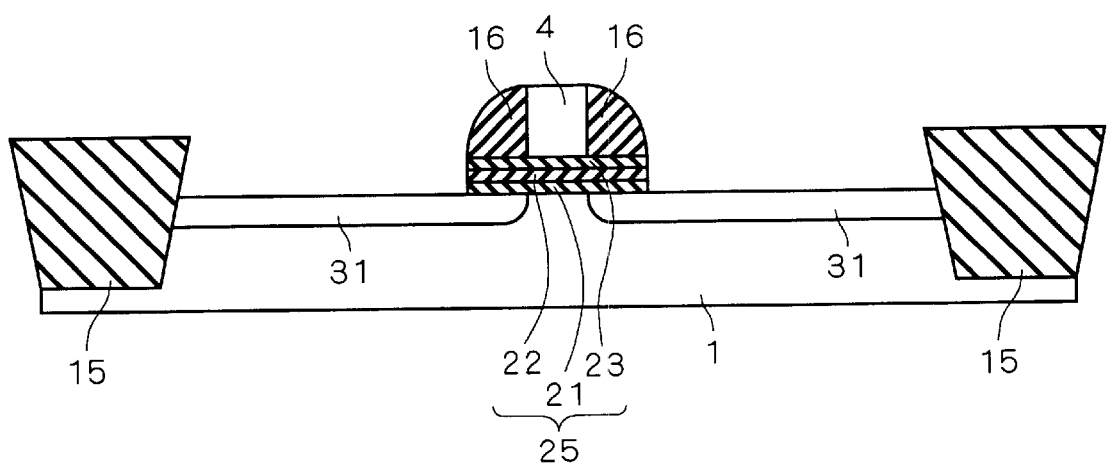

Next, a nitride film 32 is formed on the entire surface as shown in FIG. 15 and etched back as shown in FIG. 16 to form the side walls 16 on the sides of the gate-shaped polysilicon layer 4. During this process, the hard mask pattern 5a is removed and the HfSiO$_2$ film 21, HfO$_2$ film 22 and HfSiO$_2$ film 23 are also removed except under the polysilicon layer 4 and side walls 16. The nitride film 32 is 30 to 100 nm thick.

(Source/drain Regions)

Figure 17:
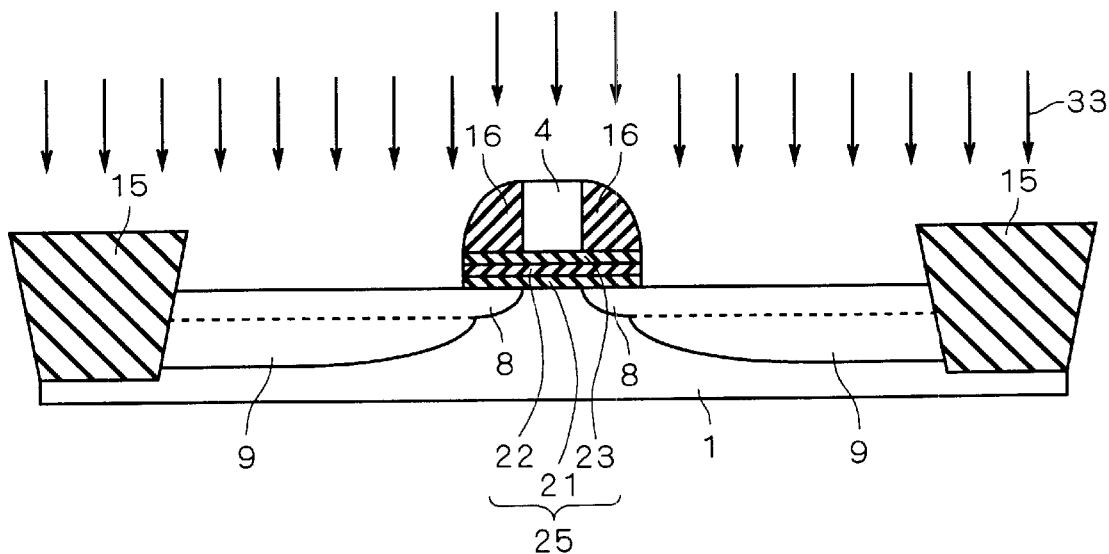

Subsequently, as shown in FIG. 17, impurity ions 33 are implanted with a resist mask formed in the NMOS or PMOS formation region (FIG. 17 does not show the resist mask since it shows an element formation region where the resist mask is not formed), so as to form the NMOS and PMOS source/drain regions 9. Then a thermal process is performed to activate the implanted impurities. During this process the impurity diffusion regions 31 under the side walls 16 form the extension regions 8.

For example, for the ion implantation to NMOS, arsenic is implanted at an implant energy of 10 to 100 keV with a dose of $1\times10^{15}$cm$^{-2}$ to $5\times10^{16}$cm$^{-2}$, for example. For PMOS, BF$_2$ is implanted at an implant energy of 5 to 50 keV with a dose of $1\times10^{15}$cm$^{-2}$ to $5\times10^{16}$cm$^{-2}$, for example. The thermal process is performed at 800 to 1100° C. for 1 to 30 sec.

(Silicide)

Figure 18:
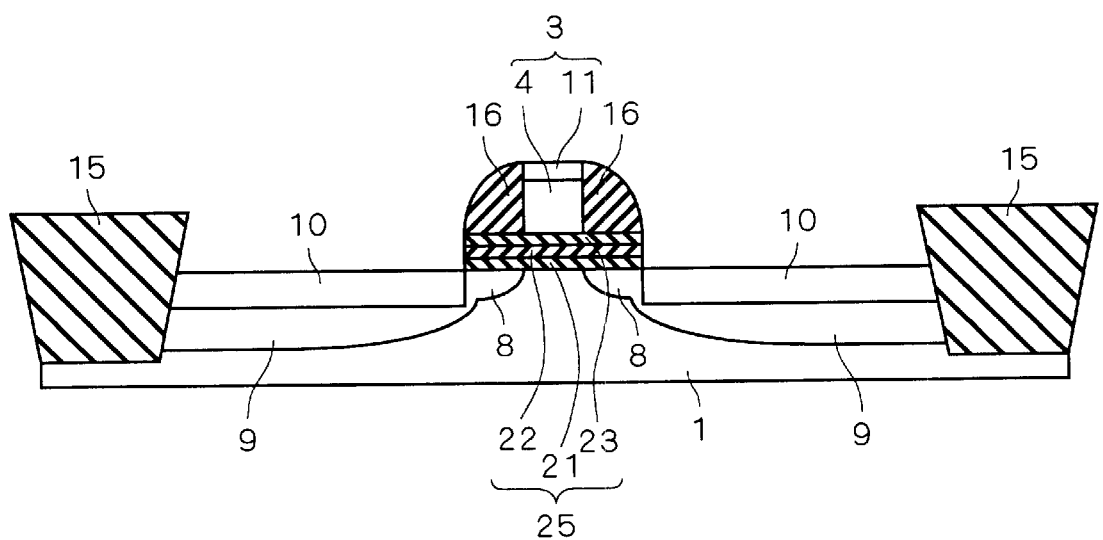

Next, as shown in FIG. 18, a metal such as cobalt is evaporated to form the silicide regions 10 in the upper part of the source/drain regions 9 and the silicide layer 11 in the upper part of the gate-shaped polysilicon layer 4. The gate electrode 3 composed of the polysilicon layer 4 and silicide layer 11 is thus obtained and the MOS transistor structure shown in FIG. 1 is completed.

(Interlayer Films etc.)

Though subsequent processes are not shown, the semiconductor device is completed through formation of interlayer insulating films, interconnections etc. according to a common method of manufacturing a semiconductor device with MOS transistors.

<Effects>

As described so far, the MOS transistor in the semiconductor device of the first preferred embodiment includes the gate electrode 3 made of polysilicon and the stacked gate insulating film 25 made of high dielectric constant insulating films.

The HfSiO$_2$ films 21 and 23 are less apt to react with Si than HfO$_2$ is. Therefore interface reaction will not occur at the interface between the HfSiO$_2$ film 23 and the gate electrode 3 and at the interface between the HfSiO$_2$ film 21 and the Si substrate 1 and therefore oxide films having uneven thickness will not be formed.

This structure therefore does not reduce the dielectric constant of the gate capacitor structure formed with the gate electrode 3, stacked gate insulating film 25 and Si substrate 1 (channel region). Furthermore, it does not reduce the mobility of carriers in the channel in the Si substrate 1 and not reduce the driving current.

Moreover, since the HfSiO$_2$ films 21 and 23 have higher dielectric constants than SiO$_2$, they do not reduce the dielectric constant of the gate capacitor structure.

As a result, the semiconductor device of the first preferred embodiment can provide an MOS transistor which uses polysilicon as the gate electrode and which can operate at high speed even at low power-supply voltages, thus achieving lower power consumption and higher speed operation.

Further, through the relatively easy processes shown in FIGS. 4 to 6 and 16, the stacked structure of the HfSiO$_2$ film 21, HfO$_2$ film 22 and HfSiO$_2$ film 23 realizes the stacked gate insulating film 25 which has a dielectric constant higher than that of silicon oxide film and in which the reactivity to the Si substrate 1 and the gate electrode 3 (the polysilicon layer 4) is lower in the lower part (HfSiO$_2$ film 21) and in the upper part (HfSiO$_2$ film 23) than in the center part (HfO$_2$ film 22).

Moreover, the use of polysilicon as the gate electrode 3 offers improved performance; e.g. the threshold voltage can be relatively freely controlled.

The stacked gate insulating film 25 can be formed thicker than a silicon oxide film to provide equal driving current, which suppresses the direct tunneling through the stacked gate insulating film 25, thus suppressing the gate leakage current and hence the standby power.

<<Second Preferred Embodiment>>

<Structure>

Figure 19:
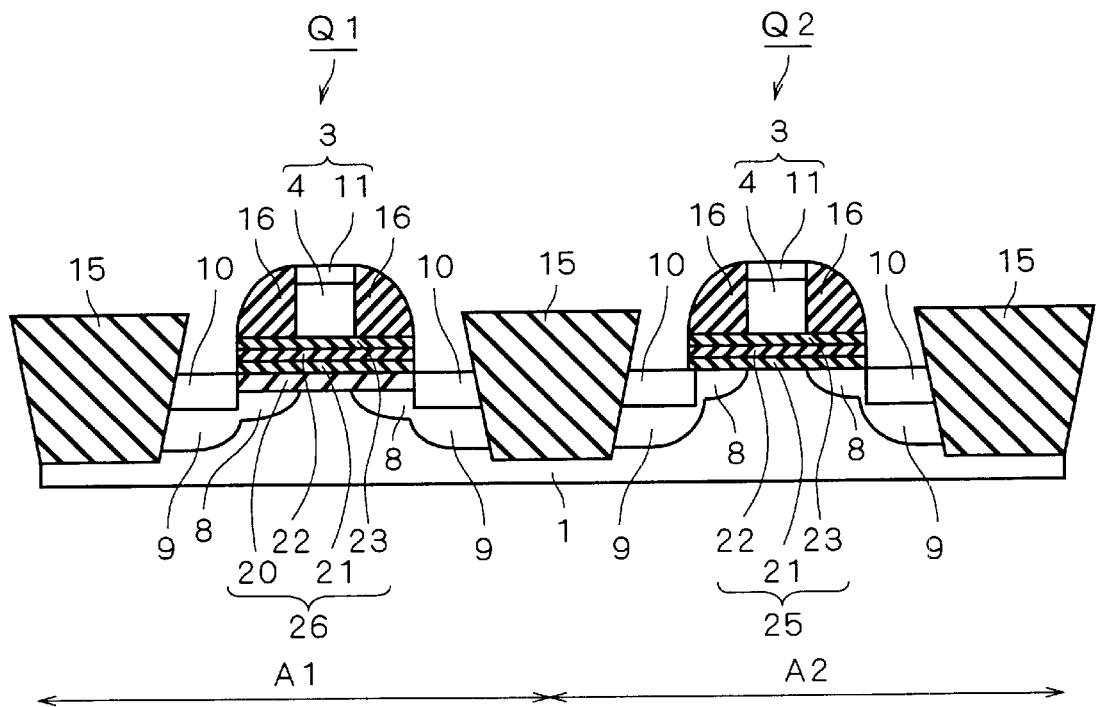
FIG. 19 is a sectional view showing the structure of MOS transistors used in a semiconductor device according to a second preferred: embodiment of the present invention.

FIG. 19 is a sectional view showing the structure of MOS transistors used in a semiconductor device according to a second preferred embodiment of the invention. As shown in this diagram, the element isolation oxide films 15 section the Si substrate 1 to form a high-voltage operation region A1 and a low-voltage operation region A2.

An MOS transistor Q2 for use at lower voltages having the three-layer stacked gate insulating film 25 of the first preferred embodiment shown in FIG. 1 is formed in the low-voltage operation region A2 and an MOS transistor Q1 for use at higher voltages having a four-layer stacked gate insulating film is formed in the high-voltage operation region A1.

The stacked gate insulating film 26 has a stacked structure composed of an oxide film 20, HfSiO$_2$ film 21, HfO$_2$ film 22 and HfSiO$_2$ film 23.

In other respects, the structure of the high-voltage MOS transistor Q1 and the low-voltage MOS transistor Q2 is the same as that of the MOS transistor of the first preferred embodiment shown in FIG. 1, so that it is not described here again.

<Manufacturing Method>

FIGS. 20 to 29 are sectional views showing a method for manufacturing the MOS transistors according to the second preferred embodiment shown in FIG. 19. The MOS transistor manufacturing method of the second preferred embodiment is now described referring to these diagrams.

(Element Isolation)

Figure 20:
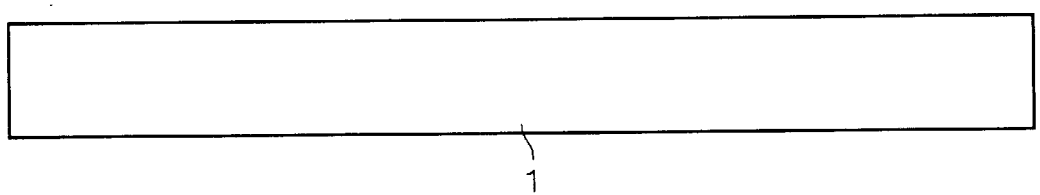
Figure 21:
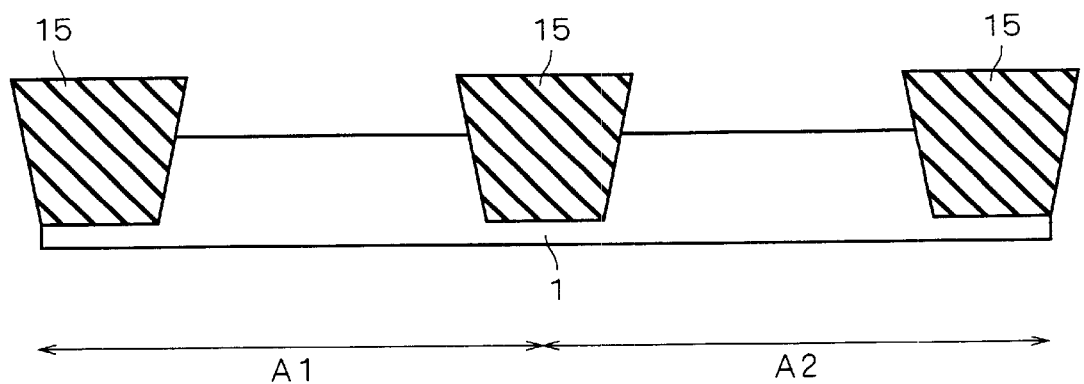

First, the Si substrate 1 is prepared as shown in FIG. 20. Then, as shown in FIG. 21, the Si substrate 1 is sectioned by element isolation of the trench isolation using the element isolation oxide films 15 to form the high-voltage operation region A1 and the low-voltage operation region A2 between the element isolation oxide films 15, 15.

(Formation of Silicon Oxide Film)

Figure 22:
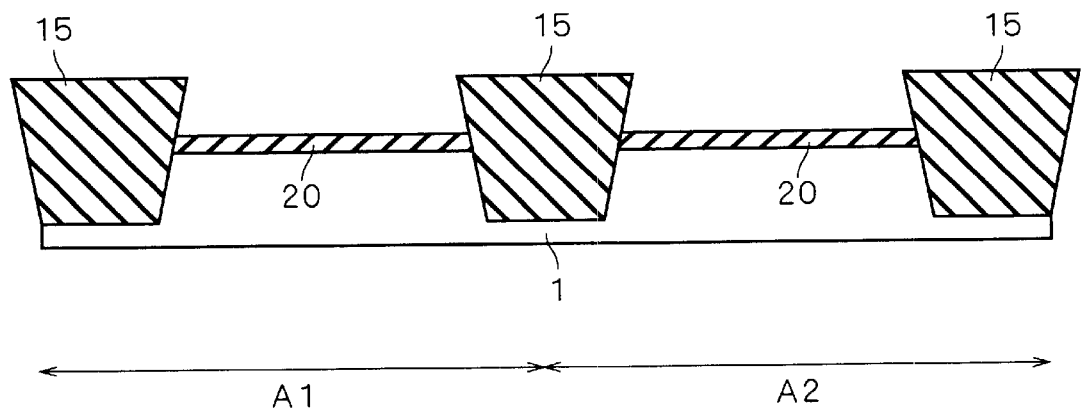

Next, as shown in FIG. 22, thermal oxidation is applied to the surface of the Si substrate 1 to form the SiO$_2$ film 20 having a thickness of 2 to 10 nm on the active regions formed in the surface of the Si substrate 1 where the element isolation oxide films 15 are absent.

Figure 23:
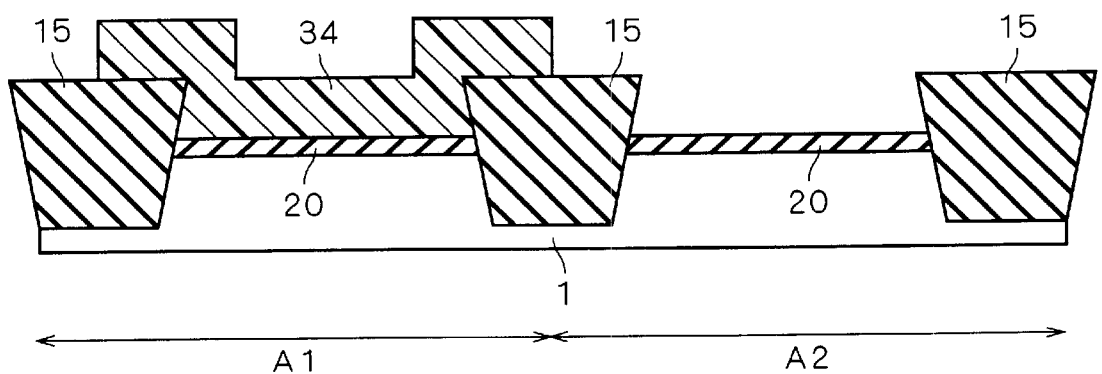

Next, as shown in FIG. 23, resist is formed and patterned by photolithography to form a resist pattern 34 which covers only the high-voltage operation region A1 and opens in the low-voltage operation region A2.

Figure 24:
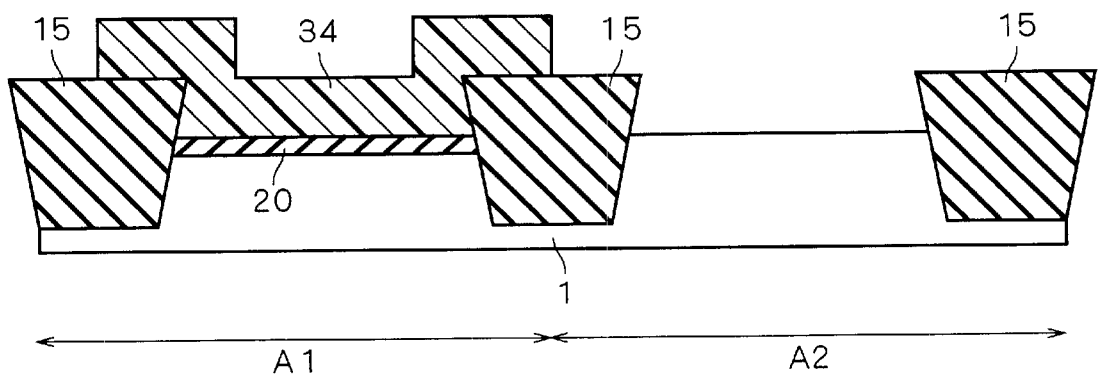
Figure 25:
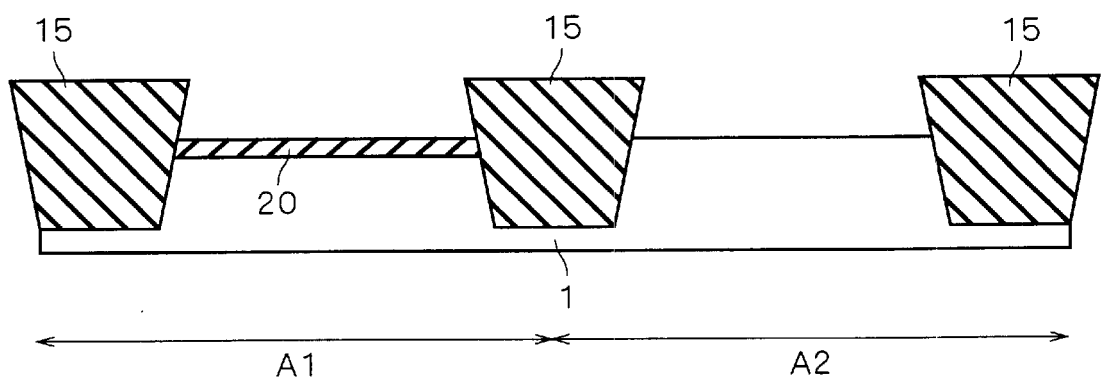

Subsequently, as shown in FIG. 24, it is dipped in a chemical mainly containing HF to remove only the SiO$_2$ film 20 in the low-voltage operation region A2, and then the resist pattern 34 covering the high-voltage operation region A1 is removed as shown in FIG. 25.

(Formation of Stacked High Dielectric Constant Insulating Films)

Figure 26:
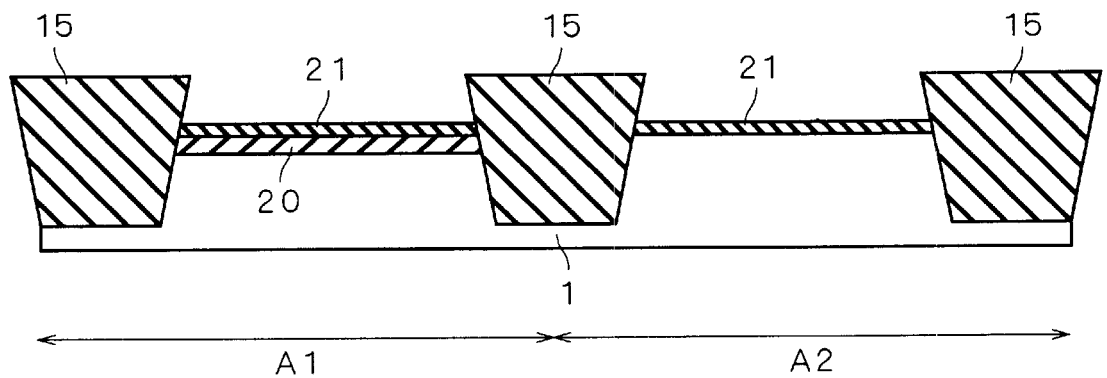

Next, as shown in FIGS. 26 to 28, a series of CVD processes are applied to sequentially deposit the HfSiO$_2$ film 21, HfO$_2$ film 22 and HfSiO$_2$ film 23 in the high-voltage operation region A1 and the low-voltage operation region A2, thus forming the four-layer structure (20 to 23) in the high-voltage operation region A1 and the three-layer structure (21 to 23) in the low-voltage operation region A2.

In other respects, the HfSiO$_2$ film 21, HfO$_2$ film 22 and HfSiO$_2$ film 23 are equal in film thickness and material to those explained in the first preferred embodiment and they are manufactured by the same method.

(Gate Electrode Material Deposition—Silicide)

Figure 29:
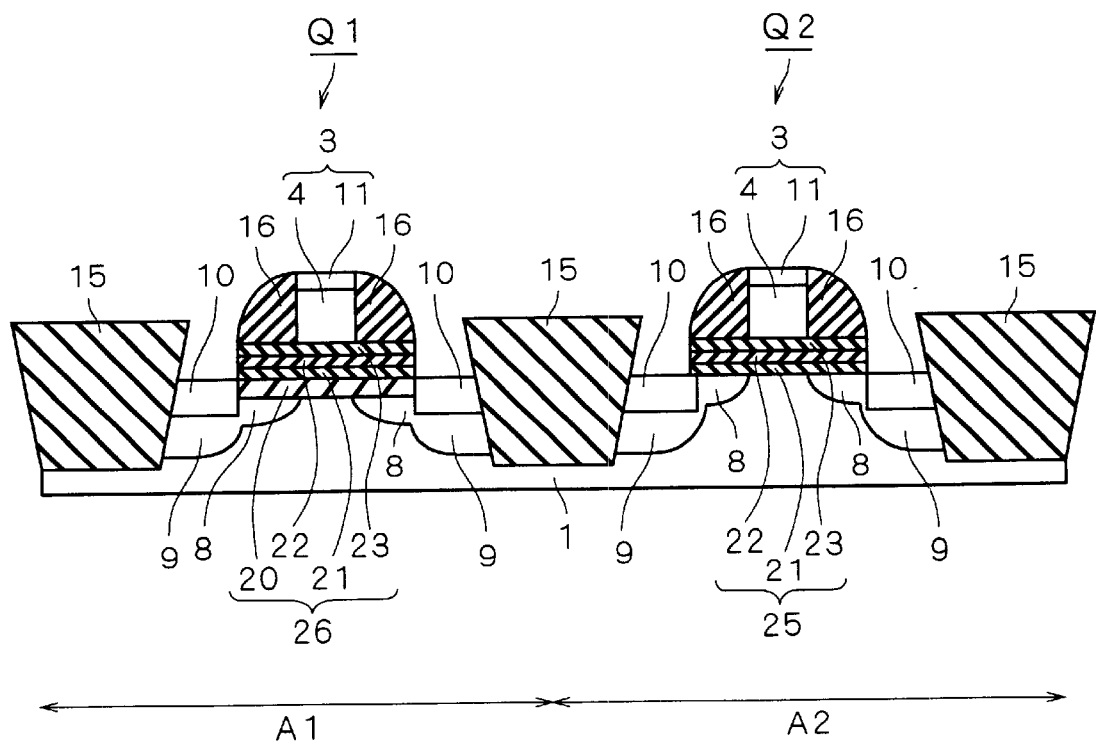
Figure 30:
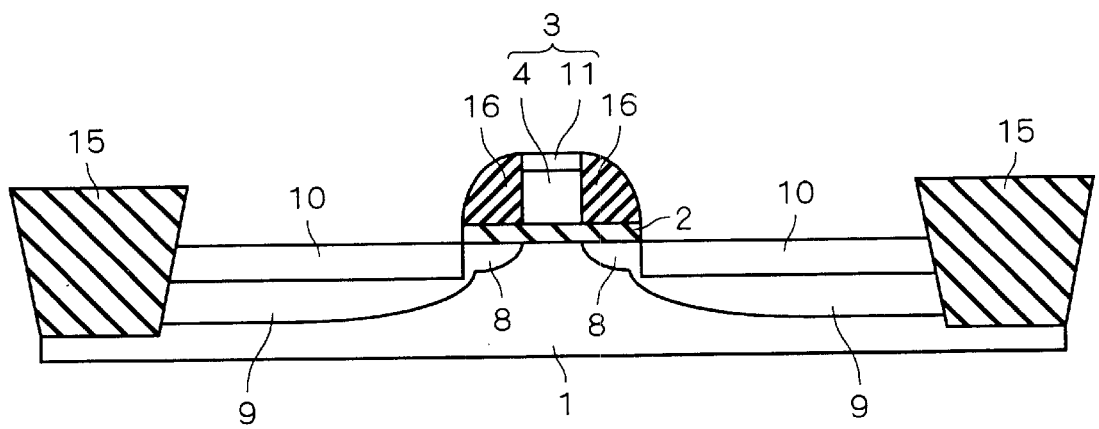
FIG. 30 is a sectional view showing the structure of a conventional MOS transistor.
Figure 31:
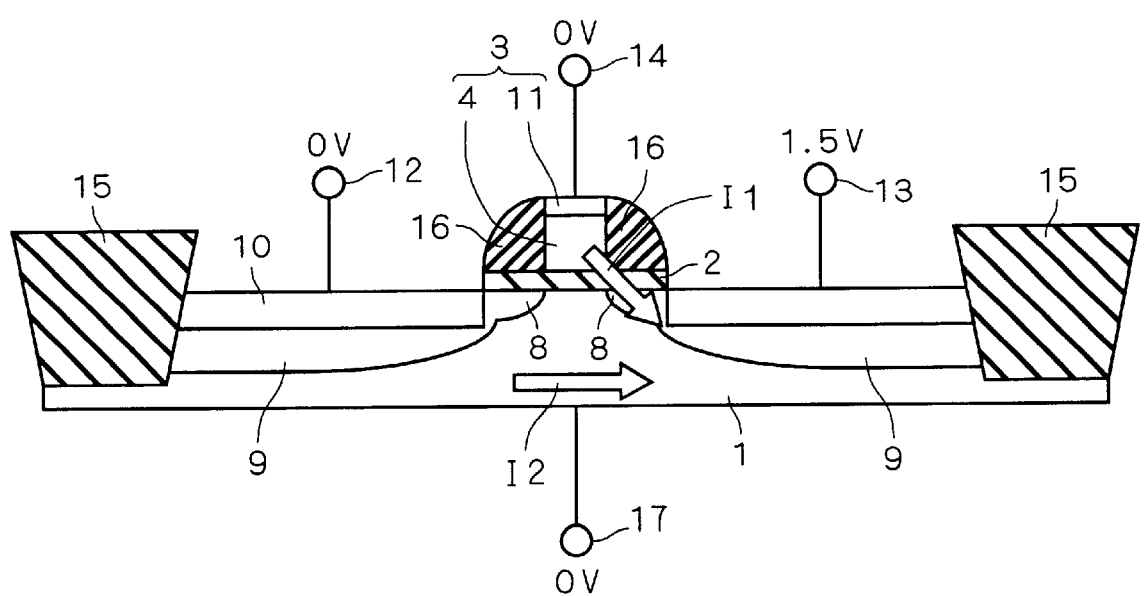
FIG. 31 is an explanation diagram used to explain a problem of the conventional MOS transistor.

Then the same processes as those shown in FIGS. 7 to 18 explained in the first preferred embodiment are performed to complete, as shown in FIG. 29, the high-voltage-use MOS transistor Q1 having the four-layer stacked gate insulating film 26 of the SiO$_2$ film 20, HfSiO$_2$ film 21, HfO$_2$ film 22 and HfSiO$_2$ film 23 in the high-voltage operation region A1, and the low-voltage-use MOS transistor Q2 having the three-layer stacked gate insulating film 25 of the HfSiO$_2$ film 21, HfO$_2$ film 22 and HfSiO$_2$ film 23 in the low-voltage operation region A2.

(Interlayer Films etc.)

Though not shown in the drawings, the semiconductor device is completed through formation of interlayer insulating films, interconnections, etc. according to a common method for manufacturing semiconductor devices having MOS transistors.

<Effects>

As stated above, in the semiconductor device of the second preferred embodiment, the MOS transistor Q1 for use at higher voltages in the high-voltage operation region A1 has the gate electrode 3 of polysilicon and the stacked gate insulating film 26 formed with the high dielectric constant insulating films 21 to 23 and the SiO$_2$ film 20. That is to say, the stacked gate insulating film 26 has the SiO$_2$ film 20 and the HfSiO$_2$ film 21 in its lower part, the HfO$_2$ film 22 in its center part, and the HfSiO$_2$ film 23 in its upper part.

The MOS transistor Q2 for use at lower voltages in the low-voltage operation region A2 has the gate electrode 3 of polysilicon and the stacked gate insulating film 25 formed with the high dielectric constant insulating films 21 to 23, like the MOS transistor of the first preferred embodiment shown in FIG. 1.

The low-voltage MOS transistor Q2 thus provides the same effect as the MOS transistor of the first preferred embodiment; i.e. it can operate as a high-speed MOS transistor even at lower voltages.

The stacked gate insulating film 26 of the high-voltage MOS transistor Q1 is formed by adding the SiO$_2$ film 20 to the structure of the stacked gate insulating film 25. Therefore it can operate as an MOS transistor having a sufficiently reliable gate insulating film even at higher voltages.

That is to say, in an LSI (semiconductor device) having the high-voltage operation region A1 and the low-voltage operation region A2 formed on the same chip, the semiconductor device of the second preferred embodiment provides MOS transistors which can be properly used in suitable voltage ranges; i.e. the high-voltage MOS transistor Q1 having a gate insulating film which is reliable even at higher voltages is formed in the high-voltage operation region A1 and the transistor which operates at high speed even at lower voltages is formed in the low-voltage operation region A2.

While the stacked structure including the $HfSiO_2$ film 21, $HfO_2$ film 22 and $HfSiO_2$ film 23 is the whole constituent element of the stacked gate insulating film 25 of the low-voltage MOS transistor Q2 and is the main constituent element of the stacked gate insulating film 26 of the high-voltage MOS transistor Q1, it can be simultaneously formed by the relatively easy processes shown in FIGS. 26 to 28, thus achieving simplification of the manufacturing process.

While the invention has been described in detail, the foregoing description is in all aspects illustrative and not restrictive. It is understood that numerous other modifications and variations can be devised without departing from the scope of the invention.

What is claimed is:

1. A semiconductor device which includes an insulated-gate transistor fabricated in a silicon substrate, said transistor comprising, a gate insulating film selectively formed on said silicon substrate, the surface of said silicon substrate under said gate insulating film being defined as a channel region, a gate electrode formed of polysilicon on said gate insulating film, and first and second source/drain regions formed in the surface of said silicon substrate with said channel region interposed therebetween, wherein said gate insulating film contains a material having a higher dielectric constant than silicon oxide film, said gate insulating film comprising an upper part, a center part and a lower part, said lower part is less reactive with said silicon substrate than said center part is, and said upper part is less reactive with said gate electrode than said center part is.

2. The semiconductor device according to claim 1, wherein said gate insulating film has first to third high dielectric constant insulating films each having a dielectric constant higher than that of silicon oxide film, said first to third high dielectric constant insulating films being stacked in the first to third order, and said lower part includes said first high dielectric constant insulating film, said center part includes said second high dielectric constant insulating film, and said upper part includes said third high dielectric constant insulating film.

3. The semiconductor device according to claim 2, wherein said first and third high dielectric constant insulating films include silicate layers, and said second high dielectric constant insulating film includes an oxide film.

4. The semiconductor device according to claim 2, wherein said first and third high dielectric constant insulating films are composed of $HfSiO_2$, and said second high dielectric constant insulating film is composed of $HfO_2$.

5. The semiconductor device according to claim 1, wherein said transistor includes first and second transistors, said first and second transistors each having said gate insulating film, said gate electrode and said first and second source/drain regions, and said gate insulating film of said first transistor is thicker than said gate insulating film of said second transistor.

6. The semiconductor device according to claim 5, wherein a first gate insulating film being said gate insulating film of said first transistor has an insulating film and first to third high dielectric constant insulating films each having a higher dielectric constant than silicon oxide film, said insulating film and said first to third high dielectric constant insulating films being stacked in this order, said lower part of said first gate insulating film includes said insulating film and said first high dielectric constant insulating film, said center part of said gate insulating film includes said second high dielectric constant insulating film, said upper part of said first gate insulating film includes said third high dielectric constant insulating film, a second gate insulating film being said gate insulating film of said second transistor has fourth to sixth high dielectric constant insulating films each having a higher dielectric constant than silicon oxide film, said fourth to sixth high dielectric constant insulating films being stacked in the fourth to sixth order, said lower part of said second gate insulating film includes said fourth high dielectric constant insulating film, said center part of said second gate insulating film includes said fifth high dielectric constant insulating film, said upper part of said second gate insulating film includes said sixth high dielectric constant insulating film.

7. The semiconductor device according to claim 6, wherein said first and fourth high dielectric constant insulating films are composed of the same material, said second and fifth high dielectric constant insulating films are composed of the same material, and said third and sixth high dielectric constant insulating films are composed of the same material.

8. The semiconductor device according to claim 7, wherein said insulating film and said second and fifth high dielectric constant insulating films include oxide films, and said first, third, fourth and sixth high dielectric constant insulating films include silicate layers.

9. The semiconductor device according to claim 7, wherein said insulating film is composed of $SiO_2$, said first, third, fourth and sixth high dielectric constant insulating films are composed of $HfSiO_2$, and said second and fifth high dielectric constant insulating films are composed of $HfO_2$.

10. A method for manufacturing a semiconductor device which includes an insulated-gate transistor fabricated in a silicon substrate, comprising the steps of:

(a) selectively forming a gate insulating film on said silicon substrate, the surface of said silicon substrate under said gate insulating film being defined as a channel region;

(b) forming a gate electrode made of polysilicon on said gate insulating film;

(c) forming first and second source/drain regions in the surface of said silicon substrate with said channel region interposed therebetween, said first and second source/drain regions, said gate insulating film and said gate electrode defining said transistor, wherein said gate insulating film is formed by using a material having a higher dielectric constant than silicon oxide film, said gate insulating film comprising an upper part, a center part and a lower part, said lower part is less reactive with said silicon substrate than said center part is, and said upper part is less reactive with said gate electrode than said center part is.

11. The semiconductor device manufacturing method according to claim 10, wherein said gate insulating film includes first to third high dielectric constant insulating films having a higher dielectric constant than silicon oxide film, said lower part includes said first high dielectric constant insulating film, said center part includes said second high dielectric constant insulating film, and said upper part includes said third high dielectric constant insulating film, said step (a) comprising the steps of,
 (a-1) forming said first high dielectric constant insulating film on said silicon substrate,
 (a-2) forming said second high dielectric constant insulating film on said first high dielectric constant insulating film, and
 (a-3) forming said third high dielectric constant insulating film on said second high dielectric constant insulating film.

12. The semiconductor device manufacturing method according to claim 11, wherein said first and third high dielectric constant insulating films include silicate layers, and said second high dielectric constant insulating film includes an oxide film.

13. The semiconductor device manufacturing method according to claim 11, wherein said step (a-1) includes a step of forming said first high dielectric constant insulating film using $HfSiO_2$ as its constituent material, said step (a-2) includes a step of forming said second high dielectric constant insulating film using $HfO_2$ as its constituent material, and said step (a-3) includes a step of forming said third high dielectric constant insulating film using $HfSiO_2$ as its constituent material.

14. The semiconductor device manufacturing method according to claim 10, wherein said transistor includes first and second transistors formed in first and second formation regions in said silicon substrate, said first and second transistors each having said gate insulating film, said gate electrode and said first and second source/drain regions, and said step (a) includes a step of forming said gate insulating film of said first transistor thicker than said gate insulating film of said second transistor.

15. The semiconductor device manufacturing method according to claim 14, wherein a first gate insulating film being said gate insulating film of said first transistor has an insulating film and first to third high dielectric constant insulating films having a higher dielectric constant than silicon oxide film, said lower part of said first gate insulating film includes said insulating film and said first high dielectric constant insulating film, said center part of said first gate insulating film includes said second high dielectric constant insulating film, said upper part of said first gate insulating film includes said third high dielectric constant insulating film, and a second gate insulating film being said gate insulating film of said second transistor has fourth to sixth high dielectric constant insulating films having a higher dielectric constant than silicon oxide film, said lower part of said second gate insulating film includes said fourth high dielectric constant insulating film, said center part of said second gate insulating film includes said fifth high dielectric constant insulating film, said upper part of said second gate insulating film includes said sixth high dielectric constant insulating film, said step (a) comprising the steps of,
 (a-1) forming said insulating film on said first formation region,
 (a-2) forming said first high dielectric constant insulating film on said insulating film,
 (a-3) forming said second high dielectric constant insulating film on said first high dielectric constant insulating film,
 (a-4) forming said third high dielectric constant insulating film on said second high dielectric constant insulating film,
 (a-5) forming said fourth high dielectric constant insulating film on said second formation region,
 (a-6) forming said fifth high dielectric constant insulating film on said fourth high dielectric constant insulating film, and
 (a-7) forming said sixth high dielectric constant insulating film on said fifth high dielectric constant insulating film.

16. The semiconductor device manufacturing method according to claim 15, wherein said first and fourth high dielectric constant insulating films are formed of the same material, said second and fifth high dielectric constant insulating films are formed of the same material, said third and sixth high dielectric constant insulating films are formed of the same material, said steps (a-2) and (a-5) are simultaneously performed, said steps (a-3) and (a-6) are simultaneously performed, and said steps (a-4) and (a-7) are simultaneously performed.

17. The semiconductor device manufacturing method according to claim 16, wherein said insulating film and said second and fifth high dielectric constant insulating films comprise oxide films, and said first, third, fourth and sixth high dielectric constant insulating films comprise silicate layers.

18. The semiconductor device manufacturing method according to claim 16, wherein said step (a-1) includes a step of forming said insulating film using $SiO_2$ as its constituent material, said step (a-2) includes a step of forming said first high dielectric constant insulating film using $HfSiO_2$ as its constituent material, said step (a-3) includes a step of forming said second high dielectric constant insulating film using $HfO_2$ as its constituent material, said step (a-4) includes a step of forming said third high dielectric constant insulating film using $HfSiO_2$ as its constituent material, said step (a-5) includes a step of forming said fourth high dielectric constant insulating film using $HfSiO_2$ as its constituent material, said step (a-6) includes a step of forming said fifth high dielectric constant insulating film using $HfO_2$ as its constituent material, and said step (a-7) includes a step of forming said sixth high dielectric constant insulating film using $HfSiO_2$ as its constituent material.

* * * * *